(12) United States Patent
Rudmann et al.

(10) Patent No.: US 7,692,256 B2
(45) Date of Patent: Apr. 6, 2010

(54) METHOD OF PRODUCING A WAFER SCALE PACKAGE

(75) Inventors: Hartmut Rudmann, Unterlunkhofen (CH); Stephan Heimgartner, Lucerne (CH); Markus Rossi, Jona (CH)

(73) Assignee: Heptagon Oy, Espoo (FI)

( * ) Notice: Subject to any disclaimer, the term of this patent is extended or adjusted under 35 U.S.C. 154(b) by 277 days.

(21) Appl. No.: 11/690,384

(22) Filed: Mar. 23, 2007

(65) Prior Publication Data

US 2008/0230934 A1    Sep. 25, 2008

(51) Int. Cl.
  *H01L 27/14* (2006.01)
  *H01L 29/82* (2006.01)
  *H01L 21/00* (2006.01)

(52) U.S. Cl. ............... 257/414; 257/432; 257/E31.127; 438/22; 438/24; 438/27; 438/65; 438/69

(58) Field of Classification Search ........... 438/22, 438/24, 25, 27, 29, 65, 69; 257/252, 257, 257/414, E31.127, 432

See application file for complete search history.

(56) References Cited

U.S. PATENT DOCUMENTS 6,844,978 B2 *   1/2005   Harden et al. ............... 359/619

| | | |
|---|---|---|
| 2002/0141062 A1 | 10/2002 | Christoffersen et al. |
| 2003/0010431 A1 | 1/2003 | Feldman et al. |
| 2004/0040648 A1 | 3/2004 | Harden et al. |
| 2006/0113701 A1 | 6/2006 | Rudmann et al. |
| 2006/0210769 A1 | 9/2006 | Swindlehurst et al. |
| 2007/0216046 A1 | 9/2007 | Rudmann et al. |
| 2007/0216048 A1 | 9/2007 | Rudmann et al. |
| 2007/0216049 A1 | 9/2007 | Rudmann et al. |

FOREIGN PATENT DOCUMENTS

WO      2004/027880      4/2004

* cited by examiner

*Primary Examiner*—Hsien-ming Lee
(74) *Attorney, Agent, or Firm*—Rankin, Hill & Clark LLP (57) ABSTRACT

A method for manufacturing a wafer scale package including at least one substrate having replicated optical elements. The method uses two substrates, at least one of which is pre-shaped and has at least one recess in its front surface. Optical elements are replicated on a first substrate by causing a replication tool to abut the first substrate. The second substrate is then attached to the first substrate in an abutting relationship in such a way that the optical element is contained in a cavity formed by the recess in one of the substrates in combination with the other substrate. Thereby, a well defined axial distance between the optical elements and the second substrate is achieved. Consequently, a well defined axial distance between the optical elements and any other objects attached to the second substrate, e.g. further optical elements, image capturing devices, light sources, is also established.

37 Claims, 8 Drawing Sheets

METHOD OF PRODUCING A WAFER SCALE PACKAGE

BACKGROUND OF THE INVENTION

1. Field of the Invention

The invention is in the field of manufacturing optical elements by means of a replication process. More concretely, the invention relates to a method to produce a wafer scale package of at least two wafer-like substrates, wherein at least one comprises a plurality of optical elements. The invention further relates to a wafer scale package as such.

2. Description of Related Art

Manufacture of optical elements by replication techniques, such as embossing or molding, is known. Of special interest for mass production are wafer-scale manufacturing processes where an array of optical elements is fabricated on a disk-like structure ("wafer") by means of replication. Subsequent to replication, this wafer structure is separated into individual optical elements ("dicing").

Replication techniques include injection molding, roller hot embossing, flat-bed hot embossing, UV embossing. As an example, in the UV embossing process, the surface topology of a master structure is duplicated into a thin film of a UV-curable replication material such as an UV curable epoxy resin on top of a substrate. The replicated surface topology can be a refractive or a diffractive optically effective structure, or a combination of both. For replicating, a replication tool bearing a plurality of replication sections that are a negative copy of the optical structures to be manufactured is prepared, for example, from a master. The tool is then used to UV-emboss the epoxy resin. The master can be a lithographically fabricated structure in fused silica or silicon, a laser or e-beam written structure, a diamond turned structure or any other type of structure. The master may also be produced in a multi stage generation process by replication from a super master.

To achieve a cost effective mass production of replicated optical components, a wafer-scale replication process is desirable. A wafer or substrate in the meaning used in this text is a disc or a rectangular plate or a plate of any other shape of any dimensionally stable, often transparent material. The thickness is normally much smaller than the extent in the other two dimensions; this is also designated as "generally flat". A plane of the wafer may be defined as a plane running perpendicular to the direction defined by the direction of the smallest extent of the wafer, e.g. normal to the disc or rectangular plate.

The diameter of a wafer disk is typically between 5 cm and 40 cm, for example between 10 cm and 31 cm. Often, it is cylindrical with a diameter of either 2, 4, 6, 8 or 12 inches, one inch being about 2.54 cm. The wafer thickness is for example between 0.2 mm and 10 mm, typically between 0.4 mm and 6 mm.

If light needs to travel through the wafer, the wafer is at least partially transparent. Otherwise, the wafer can be non-transparent as well. It can also be a wafer bearing electro-optical components, e.g. a silicon, GaAs, or CMOS wafer.

The wafer-scale replication allows the fabrication of several hundreds of generally identical structures with a single step, e.g. a single or double-sided UV-embossing process. The subsequent separating (dicing) step of the wafer then yields the individual optical components.

Integrated optical subsystems include functional elements, at least one of which is an optical element, stacked together along the general direction of light propagation (z-axis). Thus, light travelling along the z-axis passes through the multiple elements sequentially. These elements are integrated such that further alignment with themselves is not needed, leaving only the integrated optical subsystem to be aligned with other systems.

Integrated optical subsystems can be manufactured by stacking wafers that comprise functional, e.g. optical, elements in a well defined spatial arrangement on the wafer. Such a wafer scale package comprises at least two wafers that are stacked along the axis corresponding to the direction of the smallest wafer dimension (z-axis, axial direction) and attached to one another. One of the wafers bears optical elements and the other can comprise or can be intended to receive functional elements, such as optical or electro-optical elements. It is also possible that a second wafer does not bear any functional elements but acts as a cover or protection plate only. A plurality of integrated optical subsystems arranged side by side is formed by stacking the wafers in such a way that the optical or other functional elements are aligned. Subsequent dicing then yields the individual integrated optical subsystems.

There are different ways to attach the wafers to one another in order to achieve the wafer package. It is, for example, known to apply an adhesive layer or adhesive matrix directly in between the two wafers. Other known wafer packages, e.g. as disclosed in US 2003/0010431 or WO 2004/027880, comprise a spacer means, e.g. a plurality of separated spacers or an interconnected spacer matrix, arranged in between the two wafers. WO 2004/027880 mentions that the spacer matrix may also be part of one of the wafers.

Precise positioning of the functional elements along the z-axis, i.e. perpendicular to the plane of the wafers, is in many cases essential for the function of the integrated optical subsystem. Known wafer packages and production processes do not enable precise control of the z-distance of the functional elements that have to be aligned. For example, if only an adhesive matrix is used, it is difficult to establish a well defined thickness thereof, in particular if the optical element itself has a given extension in z-direction. Furthermore, though WO 2004/027880 controls the z-distance of the two wafers with respect to one another with the spacer means, there is no precise control of the z-position of one optical element on one wafer with respect to the other wafer or a functional element thereon, as its position with respect to its wafer may vary, especially if a replication technique is used.

It is often desired to reduce the dimensions of a wafer scale package in axial (z-) direction. The wafer itself, however, cannot be made arbitrarily thin without adversely affecting its stability.

BRIEF SUMMARY OF THE INVENTION

It is therefore an object of the present invention to provide a method of producing a wafer scale package of at least two wafers that enables a precise control of the position of an optical element that is produced by means of a replication technique on a first wafer with respect to a functional element or another reference on a second wafer, e.g. the front or back surface of the second wafer. In particular, it is desirable to control said position as measured in a direction perpendicular to the wafer plane.

It is another object of the invention to provide a wafer scale package with optical elements on a first wafer in a well defined spatial relationship with respect to a second wafer.

It is a further object of the invention to provide a wafer scale package and a method for producing it, wherein the package can be manufactured with small dimensions in axial (z-) direction.

This object is achieved by a method of producing a wafer scale package and by a wafer scale package having the features of the independent claims. Preferred embodiments are described in the dependent claims, the description and the figures.

The invention concerns a method of producing a wafer scale package comprising a first substrate (first wafer) with a plurality of optical elements produced by means of replication and a second substrate (second wafer) stacked in axial direction. The axial direction is a direction normal to a plane defined by the generally flat first and second wafer, i.e. normal to the (macroscopic) wafer surface or in the direction defined by the smallest wafer dimension. The axial direction generally, but not necessarily, corresponds to the direction of the optical axes of the optical elements. The axial direction is also referred to as the z-direction. Distances mentioned in the context of the invention are distances measured in the z-direction.

The second substrate may comprise a plurality of functional elements, e.g. image capturing elements, light sources, passive optical elements like lenses or polarizers, electro-optical elements, or may be intended to receive such functional elements at a later manufacturing stage. It is also possible that the second substrate serves as a cover only without being intended to receive any of such elements. The second substrate defines a second substrate abutment plane running perpendicular to the axial direction. The second substrate abutment plane may be defined by a front or back surface of the second wafer, for example.

The inventive method provides a wafer package wherein the optical elements arranged at the first substrate have a predetermined axial distance from this second substrate abutment plane or any other reference plane running parallel thereto. Assuming that the functional elements are or will be attached with a well defined distance to the second substrate abutment plane, a precise control of the distance of the functional elements and the replicated optical elements is achieved.

To achieve this, the inventive method includes the following steps:
  Providing a first substrate and a second substrate, wherein at least one of the first substrate and the second substrate is pre-shaped and comprises at least one recess;
  providing a replication tool having a plurality of replication sections having structural features corresponding to the shape of the optical elements;
  producing the optical elements on the first substrate by moving the replication tool and the first substrate towards one another, with a replication material in a deformable state located between the replication tool and the first substrate, causing the first substrate to abut against the replication tool with replication material remaining between the replication sections and the first substrate, hardening the replication material, and separating the first substrate and the replication tool;
  moving the first substrate and the second substrate towards one another and causing the first substrate to abut against the second substrate such that at least one cavity is formed in the region of the recess, wherein at least one optical element is located in the at least one cavity;
  connecting the first substrate and the second substrate.

The inventive wafer scale package is, in particular, manufactured by the inventive method, but may also be manufactured by other suited methods. It comprises two substrates and a plurality of optical elements, wherein the substrates are stacked in an axial direction. At least one of the substrates is pre-shaped in such a way that it has at least one recess in its front surface, or in its back surface, or in both. The other substrate may be a standard wafer with unstructured surfaces or may be pre-shaped as well with one or more recesses in the front and/or rear surface. The first substrate and the second substrate are connected to one another in such a way that the first substrate abuts at the second substrate. The optical elements are arranged in the cavity formed by the at least one recesses of one substrate in combination with the other substrate at a predetermined axial distance from a reference plane defined by the second substrate.

A pre-shaped wafer comprising a front surface that has at least one recess and defines an abutment plane is particularly suited for the use in the inventive method.

The following effect is achieved by the invention: The front surface of the first substrate defines an abutment/reference plane of the first substrate serving as a stop for the replication tool. This plane, thus, confines movement of the replication tool towards the first substrate. Because the replication tool abuts at the abutment plane of the first substrate, the abutment plane acts as a reference such that the axial distance between this reference and the replicated optical element (more particularly, a given surface point thereof, e.g. the vertex of a lens) is fixed. This axial distance corresponds to the axial distance of the replication sections to a tool reference plane that is, for example, defined by those surface structures of the tool that abut at the first substrate. It can thus be precisely controlled by choosing an appropriate shape of the tool. This has the advantage that the exact amount of replication material does not influence the axial position of the optical element with respect to the first surface reference plane. In particular if the first substrate comprises the at least one recess, the shape of this recess itself does not influence the axial position of the optical element. Variations of the surface structure of the first substrate are compensated by the replication material. Furthermore, the abutment plane also serves for correct positioning of the second substrate. Generally, a front or back surface of the second substrate may be considered as defining a second substrate abutment plane, and the two abutment planes are brought in overlapping relationship. Consequently, the distance of the optical element with respect to the second substrate or any further element arranged at the second substrate in a given spatial relationship to the second substrate abutment plane, e.g. at a front or back surface of the second substrate, is well defined.

As a second effect, the front surface of the first or second substrate in those regions that are not recesses acts as spacer means to enable arrangement of the optical elements having a certain axial dimension in between the two substrates without any separate spacer means. Despite a certain axial dimension of the optical element a wafer scale package with a thickness corresponding only to the sum of the thicknesses of the substrates can be manufactured. The thickness of the substrate in the region of the recess can be as small as 150 µm without affecting the stability of the package, especially if the recesses are discrete, e.g. one per optical element.

Preferably, a maximum depth of the at least one recess is greater than a maximum height of the replication sections with respect to the tool reference plane. If the recess is in the second substrate, a planar unstructured first substrate can be used, and vice versa. This simplifies manufacture of the wafer package.

The invention can be carried out in different ways. In one preferred embodiment, the surface of the first substrate that receives the optical elements in the replication process is unstructured, e.g. planar. A replication tool is used that is shaped such that it abuts at this unstructured surface, e.g. by having spacer means between the replication sections that project beyond the replication sections. Abutment of the replication tool at the unstructured surface means that the replicated optical elements have a predetermined z-distance with respect to this surface. This surface thus serves as a reference plane of the first substrate. The second substrate is pre-shaped by having at least one recess in its front or back surface which is otherwise unstructured, e.g. planar. The first and second substrate are then aligned such that the optical element is arranged in the cavity formed by the recess in the second substrate and the optical element bearing surface of the first substrate. As the second substrate abuts against the first substrate and its thickness is known, the optical element has also a well defined z-distance to the surfaces of the second substrate, in particular also to its back surface.

Further optical elements may be replicated on the back surface of the second substrate, preferably after it is attached to the first substrate. This facilitates alignment of the optical elements on the first and second substrate, because the substrates themselves do not have to be aligned with a very small tolerance, but only the replication tools used for replicating the optical elements on the first and second substrate, respectively. This order of manufacturing and the manufactured wafer scale package is further illustrated and described in FIGS. 10 and 11 and the description thereof, for example, and may be used in connection with the method as described above, and also with other suitable methods for producing a wafer scale package.

In a second preferred embodiment, the first substrate is pre-shaped and comprises a recess in one of its surfaces, for example, the front surface. The optical elements are manufactured in the recess. Again, the replication tool abuts at the first substrate such that the replicated optical elements have a well defined z-distance with respect to the front surface. The front surface thus serves as a reference plane of the first substrate. By connecting the second substrate to the first substrate the recess is closed, and a cavity housing the optical element is formed. As the second substrate abuts against the first substrate and its thickness is known, the optical element has also a well defined z-distance to the surfaces of the second substrate, in particular also to its back surface.

In both embodiments, it is possible to arrange further optical elements at the back surface of the second substrate. It is also possible to arrange further optical elements at the front surface of the second substrate (i.e. the surface facing the first substrate), e.g. in its recess in the first embodiment or in the regions aligned with the recess of the first substrate in the second embodiment. Furthermore, it is possible that the back surface of the first substrate is structured by one or more recesses that already received or are intended to receive additional optical elements or are intended to cover still further functional or optical elements on a further substrate.

Both embodiments can be combined, i.e. recesses can be arranged in both substrates. It is also possible to have recesses in the front and in the back surface of one or both substrates.

Generally, the front surface of the pre-shaped substrate may have any shape or structure that is sufficient to define an abutment plane. For example, the abutment plane may only be defined by a plurality of spikes protruding from an otherwise flat front surface or a continuous rim arranged at the perimeter of the wafer, and the major part of the front surface may be considered as a "recess". However, the following preferred embodiments have advantages concerning the production of the wafer, the stability during manufacture of the wafer package and the precision of positioning of the optical elements.

In such a preferred embodiment of the invention, the pre-shaped substrate comprises a plurality of recesses formed in an otherwise planar front surface. The recesses may, for example, have a cylindrical shape, preferably with a circular cross section. Each of the recesses is, for example, intended to receive only one optical element. In this case, a portion of the replication material applied directly to a recess is confined by lateral walls of the recess. Another preferred embodiment comprises a plurality of protrusions having a planar front face, arranged on an otherwise flat front surface (the recess then corresponds to those parts of the front surface that are not protrusions). Both arrangements are very stable with respect to bending or flexing as the other substrate and in some embodiments also the replication tool abut at and are supported by a significant part of the front surface of the pre-shaped substrate. This simplifies manufacture of the wafer package.

In a further preferred embodiment of the inventive method, also the other, e.g. the second wafer is a pre-shaped substrate having an abutment plane and preferably receives further optical elements. The same method as discussed above is used, achieving a second substrate with further optical elements in a well defined distance with respect to a second substrate abutment plane. If the two substrates are attached to one another, a well defined axial distance of the corresponding optical components is achieved. The further optical elements may be arranged on either side of the second substrate, i.e. on the surface facing the first substrate and/or the other surface.

It is also possible to stack more than two substrates, wherein at least one is pre-shaped, to form the wafer package.

The pre-shaped substrates used in the inventive method are generally made of a single piece. They can be manufactured by known methods, e.g. by etching. In this example, the abutment plane may correspond to those parts of the originally planar front surface of the substrate that are not etched away. As discussed above, the invention has the advantage that tolerances in the dimensions of the pre-shaped wafer can be compensated by the replication process.

Dicing of the wafer package then yields individual integrated optical subsystems.

A replication tool that is suited for carrying out the inventive method, especially where the first substrate has an unstructured front face, is described in the U.S. application Ser. No. 11/384,537 which is herewith incorporated by reference, in particular in FIGS. 1, 7 and 9 and the description thereof.

Replicating optical elements into a recess is described in the U.S. application Ser. No. 11/384,563, which is herewith incorporated by reference, in particular in FIG. 9 and the description thereof.

To enable abutment of the first substrate at the second substrate in order to ensure well defined z-distances it is advantageous to keep an area between replicated optical elements clear of replication material. U.S. application Ser. No. 11/384,562 discloses how this can be achieved, and is also incorporated by reference.

DESCRIPTION OF THE PREFERRED EMBODIMENTS

Figure 1A:
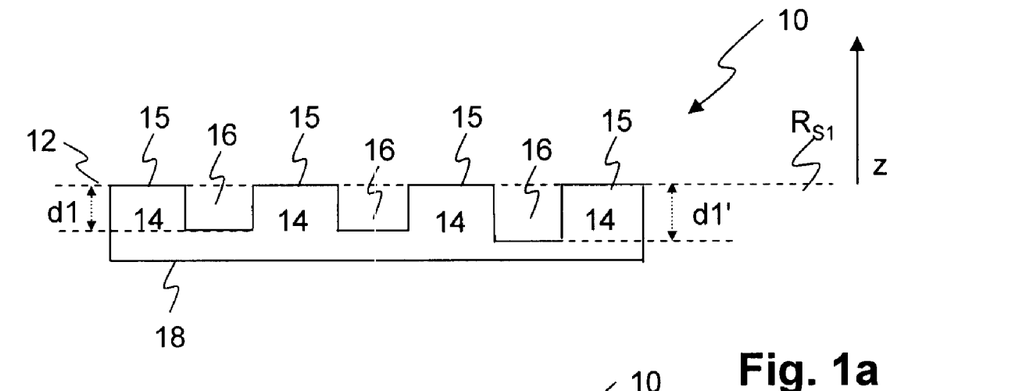
FIGS. 1a-1c show, schematically, different cross sections of pre-shaped substrates.
Figure 1B:
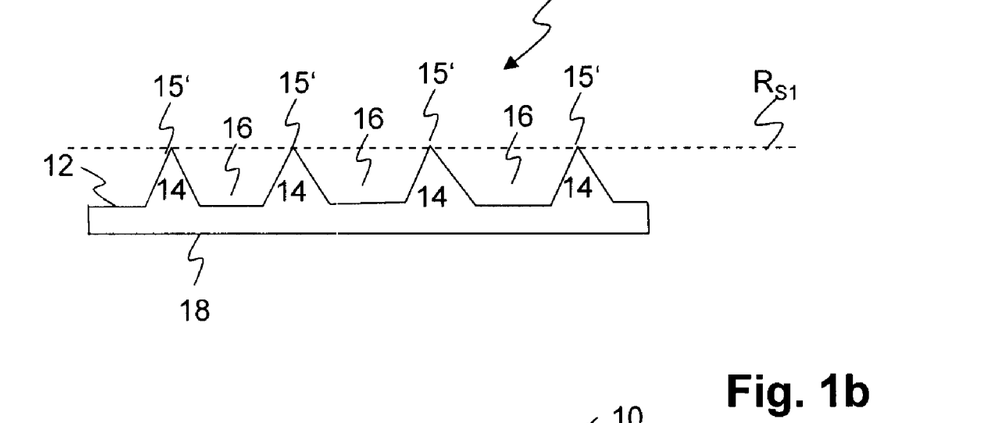
Figure 1C:
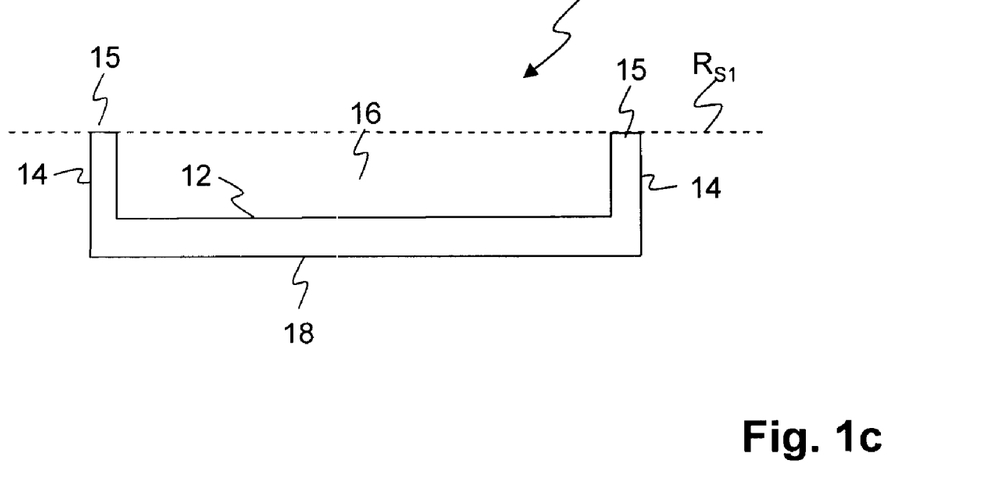

FIGS. 1a-1c show different cross sections of a pre-shaped first substrate 10 in a view perpendicular to the general orientation of the first substrate 10 and to the axial direction z. In all figures, the first substrate 10 has a planar back surface 18 and a structured front surface 12 with at least one recess 16 and at least one non-recess portion 14. The recesses 16 and non-recess portions 14 are an integral part of the substrate 10. The front faces 15 or tips 15' of the non-recess portions 14 define an abutment plane $R_{S1}$ that runs parallel to the general orientation of the first substrate (plane of the substrate). The recesses 16 are intended to accommodate the optical elements manufactured by means of replication. The z-direction, i.e. the direction of light propagation in the wafer package to be manufactured is normal to the general orientation of the first substrate and to the abutment plane $R_{S1}$. Generally, all points of the front surface 12 lie either in the abutment plane $R_{S1}$ or between the abutment plane $R_{S1}$ and the back surface 18.

Figure 2:
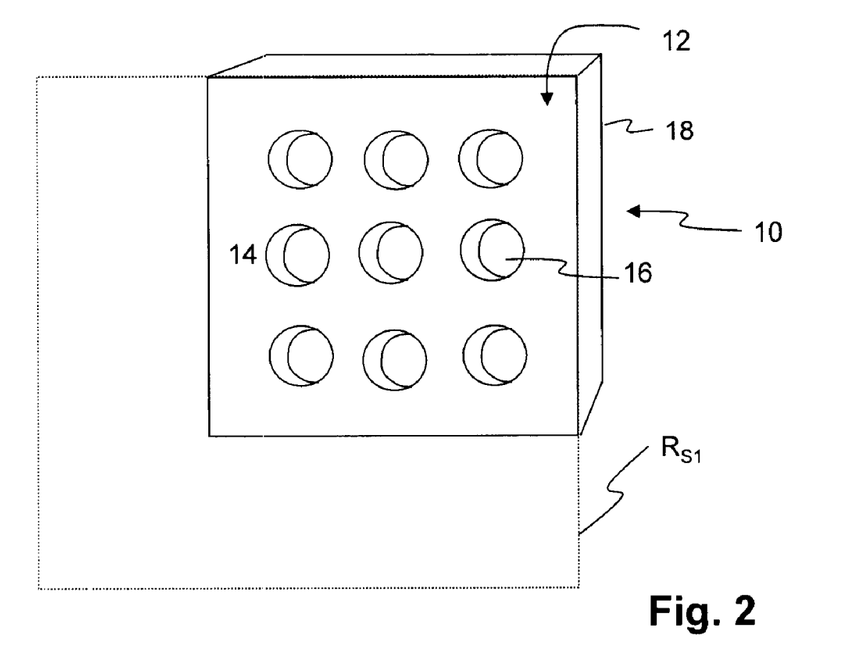
FIG. 2 shows, schematically, a 3D view of a substrate with a plurality of recesses in an otherwise flat front surface.
Figure 3:
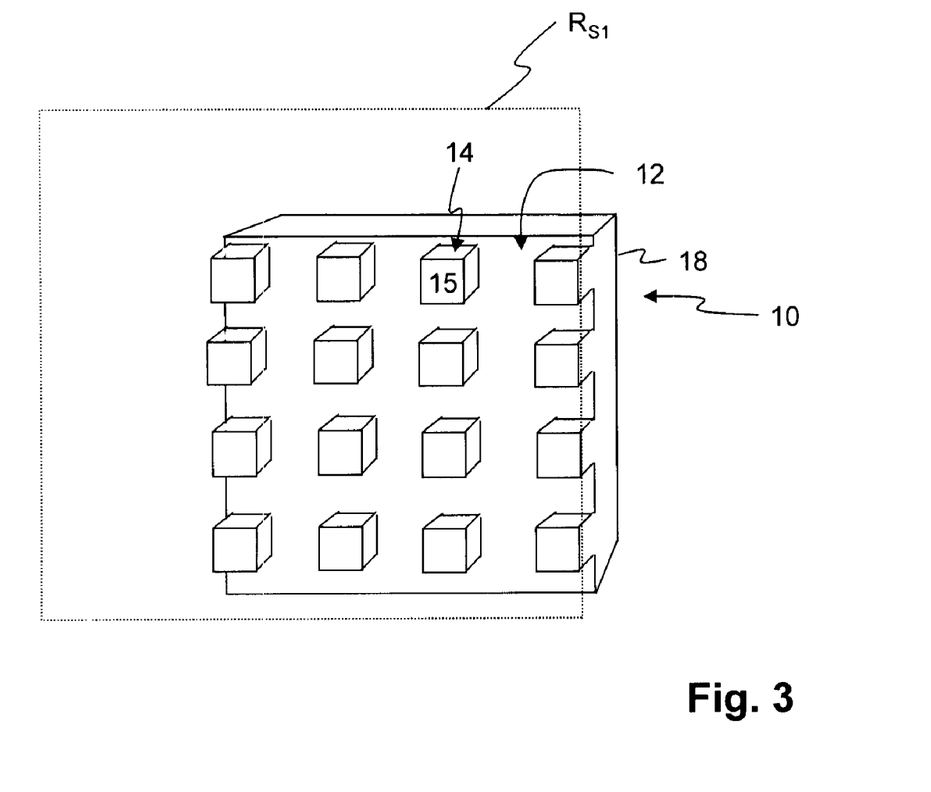
FIG. 3 shows, schematically, a 3D view of a substrate with a plurality of protrusions on an otherwise flat front surface.

In FIG. 1a, the front surface 12 is structured by a plurality of—in the sectional view—rectangular recesses 16. FIG. 1a is a cross section of a substrate as shown in FIGS. 2 and 3, for example. The front faces 15 of the non-recess portions 14 are planar and define the abutment plane $R_{S1}$. All recesses 16 have approximately the same depth d1 measured from the abutment plane $R_{S1}$, as seen in z-direction. A variation of the depth of one of the recesses 16 is designated with d1'. Such a variation can be compensated by the inventive method, as discussed below with reference to FIGS. 4a-4d.

FIG. 1b shows an example of a first substrate 10 where the abutment plane $R_{S1}$ is defined by the tips 15' of—in the sectional view—triangular non-recess portions 14 rather than by planar faces.

FIG. 1c shows another example where the non-recess portions 14 are arranged only at the periphery of the first substrate 10, forming, for example, a continuous rim or several single non-recess portions. The recess 16 in the middle of the front surface 12 is able to receive a plurality of optical elements.

FIG. 2 shows a first substrate 10 with a plurality of cylindrical recesses 16 arranged in an otherwise planar front surface 12 defining the abutment plane $R_{S1}$. The basic shape of the first substrate here is cuboid, but may as well be cylindrical with a circular base. Generally, the dimensions of the substrate 10 in z-direction are much smaller than those perpendicular thereto.

FIG. 3 shows another substrate 10 that comprises a plurality of cuboid non-recess portions 14 protruding from an otherwise planar front surface 12. These protrusions have front faces 15 that lie in a common plane and define the abutment plane $R_{S1}$.

Figure 4A:
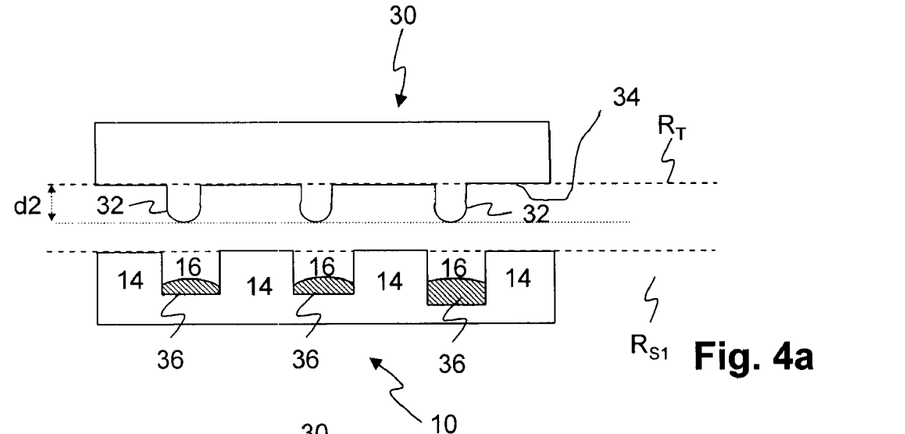
FIGS. 4a-4e show, schematically, different steps of the inventive method including the production of concave optical elements.

FIGS. 4a-4d show schematically different steps of the inventive method. In FIG. 4a, portions of replication material 36 are filled into recesses 16 of a first substrate 10, e.g. the substrate as shown in FIG. 1a, 2 or 3. The two recesses 16 on the left-hand side have a depth d1. To illustrate how the inventive method is able to equalize irregularities in the manufacture of the first substrate 10, the recess on the right is schematically shown having a different depth d1'.

A replication tool 30 having a plurality of replication sections 32 is moved in z-direction towards the first substrate 10. The replication sections 32 have a surface structure that corresponds to the negative of the surface structure of the optical elements 38 that are to be manufactured. The lateral positions of the replication sections 32 correspond to the lateral positions of the recesses 16. The replication tool 30 further comprises a reference surface portion 34 at the surface facing the first substrate 10. The reference surface portion 34 is here a planar surface portion that defines a reference plane $R_T$ of the tool 30 running perpendicular to the z-direction. Alternatively, a non-planar surface structure defining a reference plane $R_T$ of the tool 30 can be provided. Similar structures like in FIGS. 1a-1c can be used also to establish a tool reference plane $R_T$, e.g. with protrusions arranged in between the replication sections 32. The replication sections 32 have a well defined axial distance d2 from the tool reference plane $R_T$.

Figure 4B:
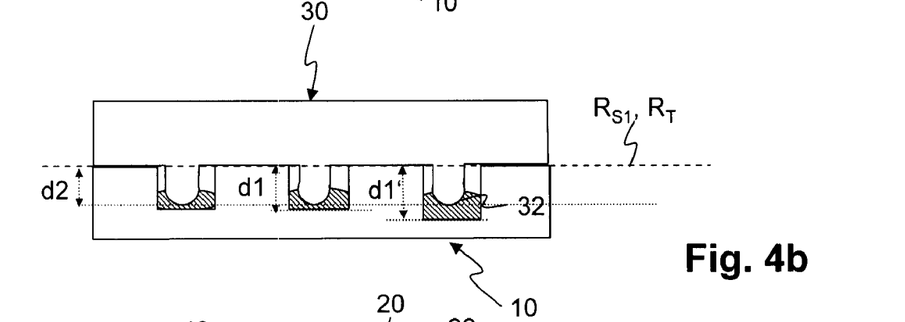

FIG. 4b shows the situation where the tool 30 abuts the first substrate 10 such that the respective abutment/reference planes $R_{S1}$, $R_T$ coincide. The non-recess portions 14 of the first substrate 10 and the reference surface portions 34 of the tool 30, thus, serve as a stop for one another. The replication sections 32 deform the replication material 36 in the desired way. After or during hardening of the replication material 36, the tool 30 and/or the first substrate 10 is removed. This step yields a first substrate 10 having replicated optical elements 38 in the recesses 16, as shown in the lower part of FIG. 4c. According to the invention, the optical elements 38 have the same distance d2 (e.g. as measured from the vertex of a concave optical element) to the first substrate abutment plane $R_{S1}$ as the replication sections 32 with respect to the tool reference plane $R_T$ irrespective of the actual depth d1, d1' of the recesses 16.

Figure 4C:
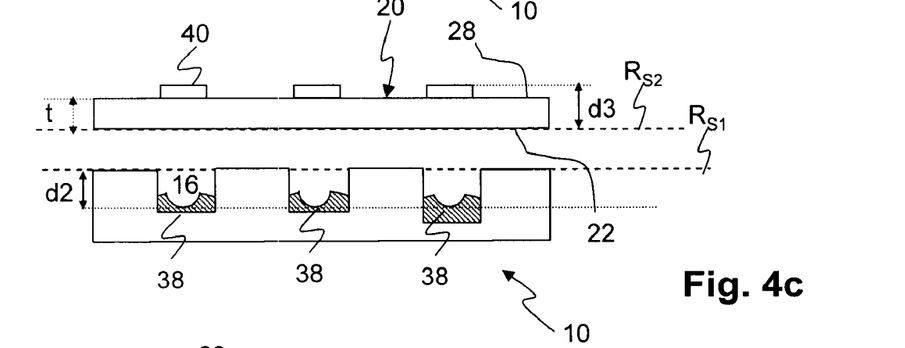
Figure 4D:
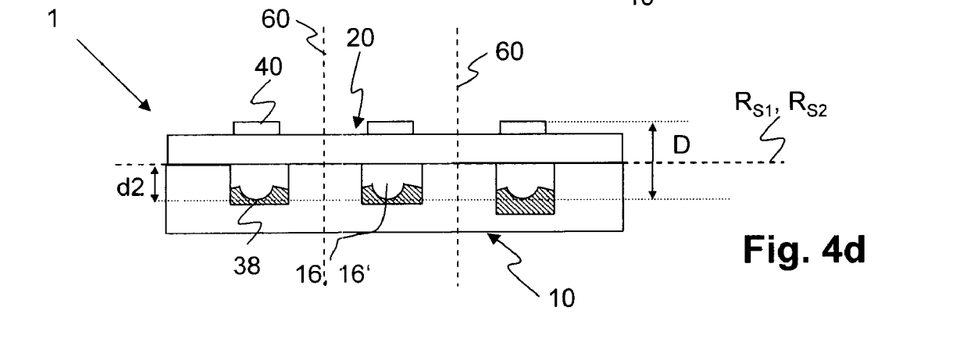

In FIG. 4c, a second substrate 20 is moved in the z-direction towards the first substrate 10 such that its front surface 22 abuts the front surface 12 of the first substrate 10. The completed wafer package 1 is shown in FIG. 4d. Functional elements 40 are arranged on the back surface 28 of the second substrate 20. Assuming a constant thickness t of the second substrate 20, the distance d3 from the front surface 22 is also well defined. The front surface 22 acts as an abutment plane $R_{S2}$ of the second substrate 20 that coincides with the first substrate abutment plane $R_{S1}$ when stacked. A closed cavity 16' is formed in the region of the recess 16. This cavity 16' houses at least one optical element 38. As a consequence, a wafer package 1 comprising optical elements 38 arranged on a first substrate 10 and functional elements 40 arranged on the second substrate 20 is provided, wherein the optical elements 38 and the functional elements 40 have a well defined axial distance D=d2+d3 irrespective of the actual depth d1, d1' of the recesses 16. The first and second substrate 10, 20 are attached to one another by means of an adhesive layer 50 arranged on the front faces 15 of the non-recess portions 14. Additionally or alternatively, the adhesive may be on the front surface 22 of the second substrate 20. The adhesive layer 50 has a thickness of 1 to 10 □m, preferably not more than 5 □m.

In a further step, the wafer package 1 may be diced along lines 60 running in an axial direction in order to produce separated integrated optical subsystems, e.g. camera devices.

Figure 4E:
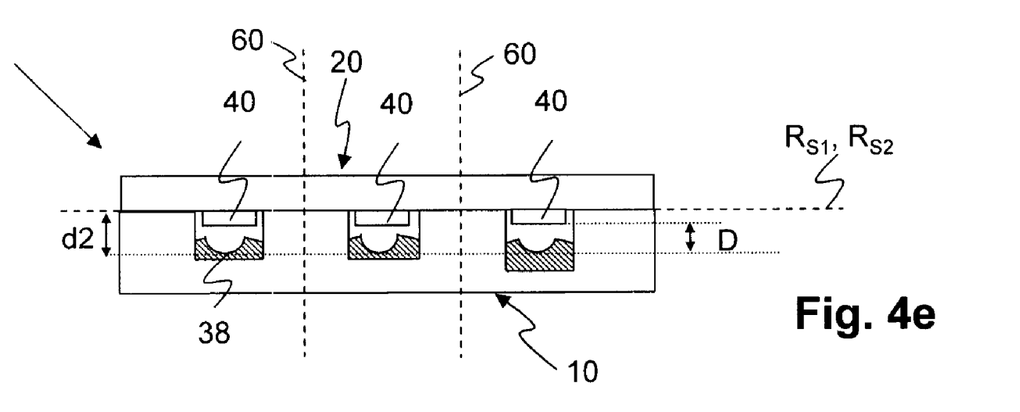

FIG. 4e shows an alternative where the functional elements 40 are attached to the front surface 22 of the second substrate 20. In this case, the second substrate 20 may be nontransparent.

Figures 5A, 5B:
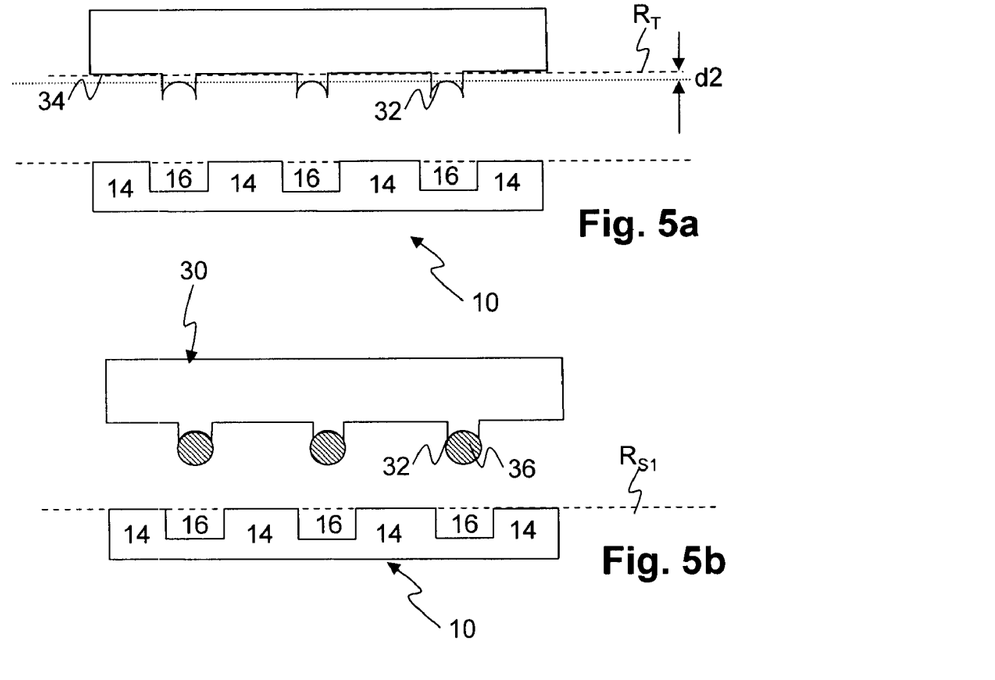
FIGS. 5a-5d show, schematically, different steps of the inventive method including the production of convex optical elements.
Figure 5C:
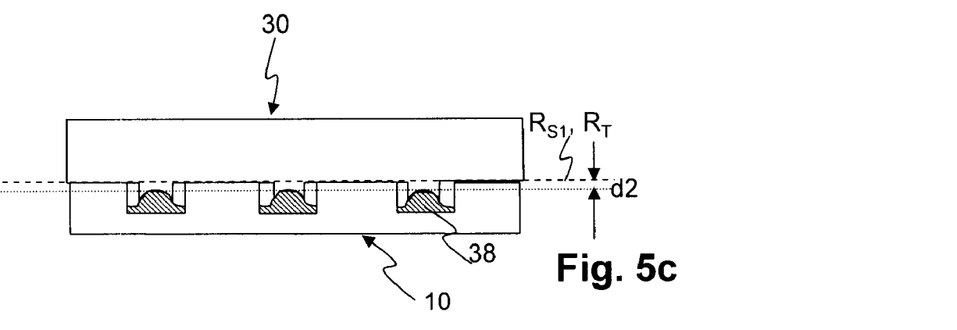
Figure 5D:
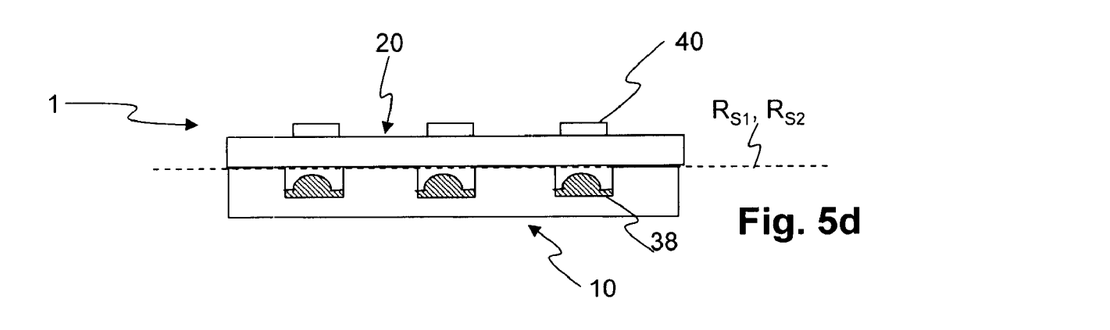

FIGS. 5a-5d show, schematically, different steps of the inventive method including the production of convex optical elements 38. A first substrate 10 has the same shape as in FIGS. 4a-4d. As shown in FIG. 5a, a replication tool 30 having a similar structure as in FIGS. 4a-4d comprises a plurality of replication sections 32 that, in this case, have a concave shape corresponding to the negative of the convex optical elements 38. The vertexes of the replication sections 32 have a predetermined axial distance d2 with respect to the tool reference plane $R_T$. In FIG. 5b, a portion of a replication material 36 is positioned onto each of the replication sections 32. In FIG. 5c, the tool 30 is moved towards the first substrate 10 such that the abutment/reference planes $R_T$, $R_{S1}$ of the tool 30 and the first substrate 10 coincide. Consequently, a convex optical element 38 having a vertex with a predetermined axial distance d2 from the substrate abutment plane $R_{S1}$ is produced. In FIG. 5d, a second substrate 20 with functional elements 40 as shown in FIGS. 4c and 4d is attached to the first substrate 10 by means of an adhesive layer 50 between the abutting faces 22, 15. As the abutment planes $R_{S1}$, $R_{S2}$ of the first and second substrate 10, 20 coincide and under the assumption of a constant thickness t of the second substrate 20, there is also a well defined axial distance D between the functional elements 40 and the optical elements 38, here measured between the back side of the functional elements 40 and the vertex of the optical element 38. It is apparent that any other point at the surface of the optical element 38 also has a well defined axial distance from the functional element 40.

It is apparent, that for the embodiments of FIGS. 4a-4d and FIGS. 5a-5d, the substrates, tools and reference planes may have any orientation, e.g. horizontal or vertical, and that in case of a horizontal arrangement, the first substrate may be arranged above or below the tool and the second substrate. Further, the first substrate may be moved towards the tool and/or the second substrate, or the tool and/or the second substrate may be moved towards the first substrate. Furthermore, the replication material 36 may be positioned into the recesses 16 and/or at the replication sections 32 for the production of both concave or convex optical elements, or any other replicated optical element. The functional elements 40 shown in FIGS. 4a-4d and FIGS. 5a-5d may be camera elements, light sources, electro-optical devices, conventional optical elements but also optical elements produced by means of replication.

Figure 6:
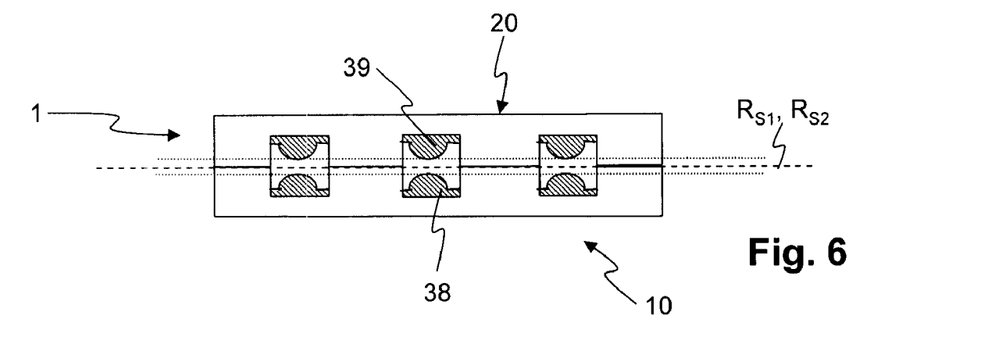
FIG. 6 shows, schematically, a wafer package comprising two pre-shaped substrates with optical elements in a well defined spatial relationship.
Figure 7:
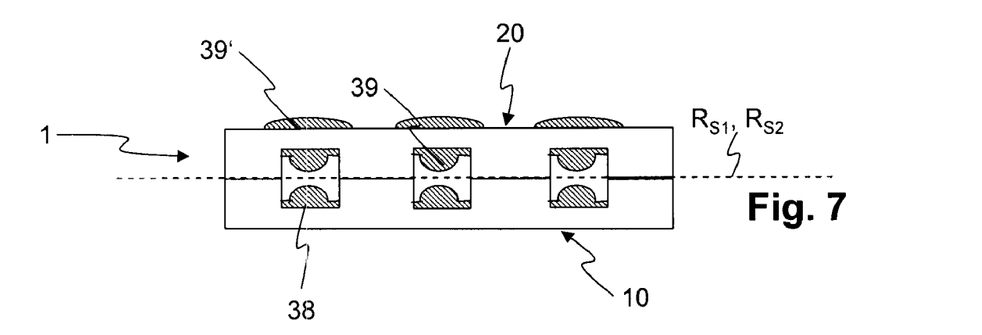
FIG. 7 shows, schematically, a further wafer package comprising two pre-shaped substrates with optical elements in a well defined spatial relationship.

FIGS. 6 and 7 show further wafer packages 1 produced by the inventive method. In both figures, a first substrate 10 is shaped like in FIGS. 4a-4d, 5a-5d and provided with a plurality of convex optical elements 38 at a well-defined axial distance d2 from the first surface abutment plane $R_{S1}$ like in FIGS. 5a-5d. A second substrate 20 is a further pre-shaped substrate having the same shape as the first substrate 10 with recesses 26 and non-recess portions 14. It is also provided with replicated optical elements 39 that are arranged in the recesses 26. For producing the optical elements 39 on the second substrate 20, the same method as in FIGS. 4a-4b or 5a-5c is preferably used. This means that also the optical elements 38 on the second substrate 20 have a well defined axial distance d3 from the second surface abutment plane $R_{S2}$, here corresponding to the front surface 22. The first and second substrates 10, 20 are attached to one another with an adhesive layer 50 between the abutting surfaces in such a way that the recesses 16, 26 and the optical elements 38, 39 face one another. Consequently, the optical elements 38, 39 have a predetermined axial distance D=d2+d3 from one another.

In FIG. 7, there are additional replicated optical elements 39' arranged on the planar back surface 28 of the second substrate 20. They may be produced by conventional replication techniques in such a way that a well defined axial distance is given between the optical element 39' (here measured from its vertex) and the back surface 28, and, assuming a constant thickness t of the second substrate 20, also between the optical element 39' and the second surface abutment plane $R_{S2}$. Consequently, there is a well defined axial relationship between the optical elements 38, 39, 39' arranged on both substrates 10, 20 of the wafer package 1.

Figures 8A, 8B:
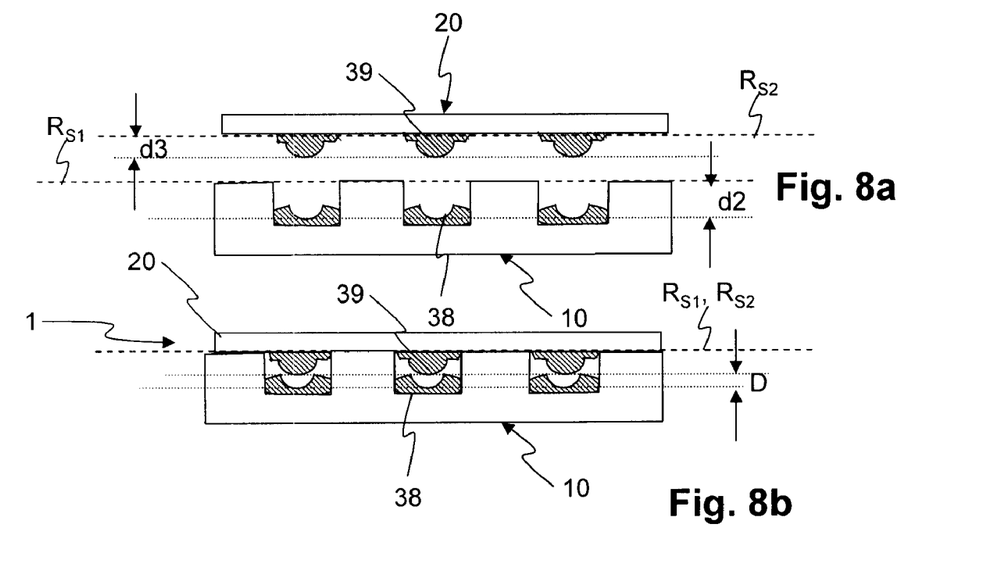
FIGS. 8a and 8b show, schematically, two wafers and a wafer package, respectively, wherein one wafer is a pre-shaped substrate and the other wafer is planar.

FIGS. 8a and 8b show another example of a wafer package 1 comprising a pre-shaped first substrate 10 and a conventional unstructured second substrate 20 before and after attaching the substrates to one another. Like in FIGS. 4a-4c, the first substrate is provided with concave optical elements 38 arranged in recesses 16 at a distance d2 from the first substrate abutment plane $R_{S1}$. The second substrate 20 has a plurality of replicated optical elements 39, here convex optical elements, arranged on its front surface 22. They are produced by conventional replication techniques in such a way that the distance d3 of each optical element 39 to the front surface 22 is constant (here measured from the vertex of the optical element). As the optical elements 39 project from the front face 22 of the second substrate 20 (here acting as second substrate abutment plane $R_{S2}$), the axial distance between the respective optical elements 38, 39 is D=d2−d3.

Figure 9:
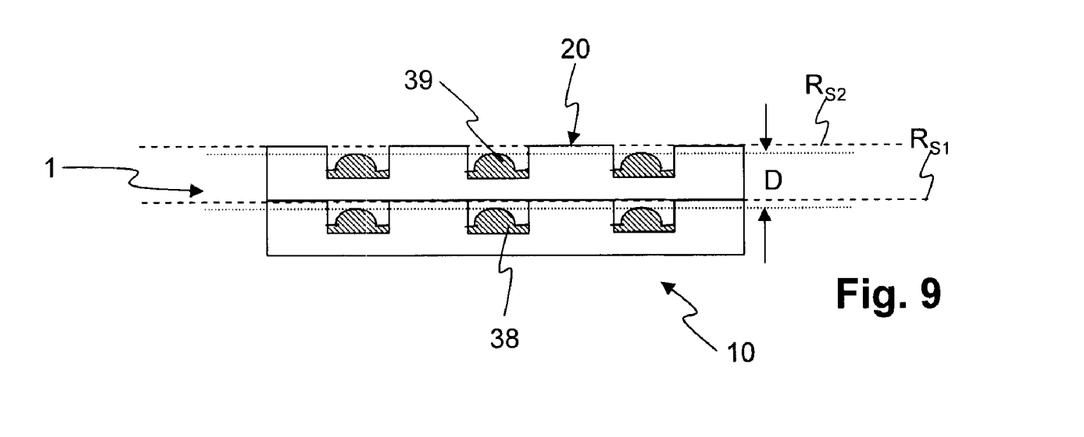
FIG. 9 shows, schematically, a further wafer package comprising two pre-shaped substrates with optical elements in a well defined spatial relationship

FIG. 9 shows another example of a wafer package 1 where the two substrates 10, 20 are each pre-shaped and provided with replicated optical elements 38, 39 like in FIG. 6. However, the recesses 16, 26 now point in the same direction, and the back surface 28 of the second substrate 20 abuts the first surface 10. Assuming a constant thickness t of the second substrate 20, the abutment planes $R_{S1}$, $R_{S2}$ for the abutment of the replication tool of the first and second substrate 10, 20 as well as the optical elements 38, 39 have a well defined axial distance with respect to one another.

It is apparent that also wafer packages comprising more than two, e.g. three or four, wafers can be manufactured using first and second substrates that are shaped as shown in the previous figures. Even in such a complex wafer package, a well defined axial relationship between the elements arranged on the different substrates can be maintained.

Furthermore, it is possible to use pre-shaped substrates having a structured front and back surface with at least one recess on either side.

Figure 10:
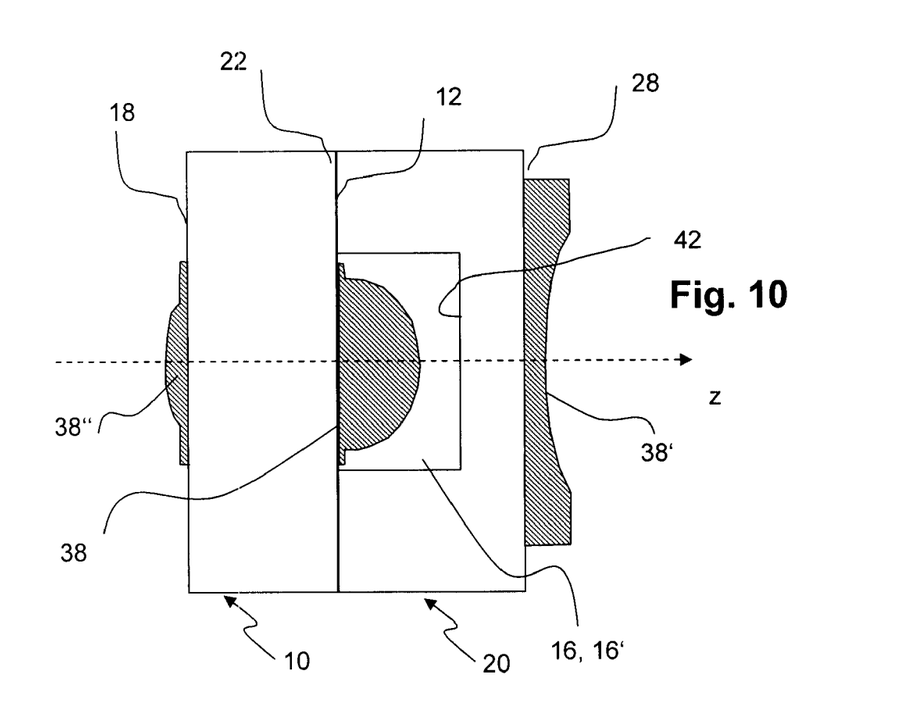
FIG. 10 shows, schematically, a further wafer package comprising an unstructured first substrate and a pre-shaped second substrate with optical elements attached to the front and back surface of the first substrate and to the back surface of the second substrate

FIG. 10 shows, schematically, a further wafer package respectively an individual integrated optical subsystem comprising an unstructured first substrate 10 and a pre-shaped second substrate 20 with optical elements 38, 38', 38" attached to the front surface 12 and to the back surface 18 of the first substrate 10 and to the back surface 28 of the second substrate 20.

In its front surface 22, the second substrate 20 has a recess 16. The recess 16 is covered by the unstructured first substrate 10 in order to form a closed cavity 16'. The cavity 16' houses and protects optical element 38 that is attached to the front surface 12 of the first substrate 10. After dicing, the optical element 38 is thus completely surrounded by the first and second substrate.

A further optical element 38' is attached to the back surface 28 of the second substrate 20 in regions corresponding to the recesses 16 on the front surface 22 of the second substrate 20. A still further optical element 38" is attached to the unstructured back surface 18 of the first substrate. All optical elements 38, 38', 38" may be concave or convex lenses and are manufactured by replication. They are aligned in the z-direction. The recess 16 has a planar bottom surface 42 that runs parallel to the front and back surfaces 12, 18, 22, 28.

The wafer package may be manufactured by the inventive method as described above, or any other suitable method. The optical elements 38, 38', 38" are produced on their respective substrates 10, 20 by a replication process.

It is preferred that in a first step, the optical element 38 that is to be arranged in the cavity 16' between the two substrates 10, 20 is produced on the first substrate 10. Then, the second substrate 20 is attached to the first substrate 10 in such a way that the recesses 16 match the positions of the optical elements 38, before optical elements 38' are produced on the second substrate 20. A completely exact alignment of the recesses with respect to the optical elements 38 is not necessary, in particular if the recesses have a planar bottom surface 42 running parallel to the front or rear surface 22, 28. In a further step, further optical elements 38' are produced on the planar back surface 28 by means of replication. This embodiment provides an easier alignment of the first and second substrate, because only the replication tools for replicating the optical elements 38, 38' on the unstructured/planar faces 12, 28 of the first and second substrate 10, 20 have to be aligned with respect to one another while alignment of the tools with respect to the substrates and alignment between the two substrates itself is not so crucial.

The additional optical elements 38" on the back surface 18 of the first substrate 10 may be made prior to or after attaching the second substrate 20.

Generally, the described order of steps (1. Replicating on first substrate; 2. Attaching second substrate; 3. Replicating on second substrate) is preferred if the optical elements on the first substrate and the further optical elements on the second substrate are both attached to a planar surface of the corresponding substrate.

Despite this, it is possible to produce the package as shown in FIG. 10 by replicating first the optical elements 38 and 38' on their respective substrates 10, 20 and then attaching the substrates 10, 20 to one another.

Figure 11:
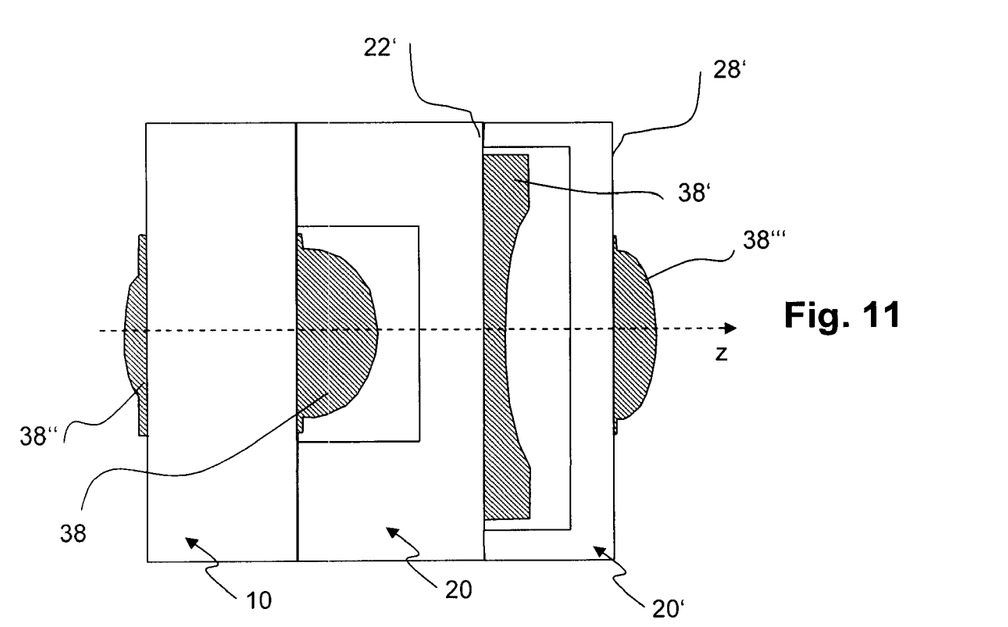
FIG. 11 shows, schematically, the wafer package as shown in FIG. 10 with a further pre-shaped substrate attached to the back surface of the second substrate.

FIG. 11 shows schematically the wafer package as shown in FIG. 10 with a further pre-shaped substrate 20' attached to the back surface 28 of the second substrate 20. The further substrate 20' comprises a further recess in its front surface 22'. This recess covers the optical element 38' on the unstructured back surface 28 of the second substrate 20. Another optical element 38''', e.g. a convex or concave lens, is arranged on the back surface 28' of the further substrate 20'. All optical elements are aligned in z-direction.

An alignment is preferably achieved by first replicating elements 38 on the first substrate 10, then attaching second substrate 20 without optical elements 38', then replicating these optical elements 38', then attaching further substrate 20' and replicating optical elements 38'''.

The addition of still further substrates in FIGS. 10 and 11 is possible. It is apparent that the overall thickness does not significantly exceed the sum of thicknesses of the individual substrates. Still, the optical elements may have an extent in z-direction, and are securely accommodated in cavities formed in and between the substrates. Precise control of the mutual distances in z-direction is achieved by the invention.

What is claimed is:

1. A method of producing a wafer scale package including two substrates and a plurality of optical elements, wherein the substrates are stacked in an axial direction, said method comprising the following steps:

providing a first substrate and a second substrate, wherein at least one of the first substrate and the second substrate is pre-shaped and comprises at least one recess;

providing a replication tool having a plurality of replication sections having structural features corresponding to a shape of the optical elements;

producing the optical elements on the first substrate by moving the replication tool and the first substrate towards one another, with a replication material in a deformable state located between the replication tool and the first substrate, causing the first substrate to abut against the replication tool with replication material remaining between the replication sections and the first substrate, hardening the replication material, and separating the first substrate from the replication tool;

moving the first substrate and the second substrate towards one another and causing the first substrate to abut against the second substrate such that at least one cavity is formed in the at least one recess, wherein at least one optical element is located in the at least one cavity;

connecting the first substrate and the second substrate.

2. The method according to claim 1, wherein the first substrate comprises a generally planar front surface and the second substrate is pre-shaped and comprises at least one recess, and wherein the step of producing the optical elements comprises forming the optical elements on the planar front surface at positions corresponding to a position of the at least one recess in the second substrate.

3. The method according to claim 1, wherein the first substrate is pre-shaped and comprises at least one recess, and wherein the step of producing the optical elements comprises forming the optical elements in the at least one recess in the first substrate.

4. The method according to claim 3, further comprising the step of applying a portion of the replication material into the at least one recess corresponding to designated positions of the at least one optical element.

5. The method according to claim 3, wherein the second substrate is pre-shaped and comprises at least one recess, and wherein the at least one cavity is formed by the recesses of the first and second substrate.

6. The method according to claim 1, wherein the first substrate is pre-shaped and has a front surface and a back surface, the front surface comprising at least one recess and defining a first substrate abutment plane running essentially perpendicular to the axial direction.

7. The method according to claim 6, wherein the step of producing the optical elements comprises causing the first substrate abutment plane to abut against the replication tool with replication material remaining between the replication sections and the at least one recess of the first substrate, and wherein the step of causing the first substrate to abut against the second substrate comprises causing the first substrate abutment plane to abut against the second substrate.

8. The method according to claim 1, wherein the second substrate is pre-shaped and has a front surface and a back surface, the front surface comprising at least one recess and defining a second substrate abutment plane running essentially perpendicular to the axial direction.

9. The method according to claim 1, wherein the step of connecting the first substrate and the second substrate to one another comprises applying an adhesive onto at least one of a portion of a surface of the second substrate, and a portion of a surface of the first substrate.

10. The method according to claim 1, wherein a maximum depth of the at least one recess is greater than a maximum distance of the replication sections with respect to those surface portions of the replication tool that abut against the first substrate.

11. The method according claim 1, wherein at least one of the first substrate and the second substrate is pre-shaped and comprises a plurality of recesses therein.

12. The method according to claim 11, wherein the plurality of recesses have a generally cylindrical shape.

13. The method according to claim 1, further comprising the step of forming at least one concave lens element with the replication tool.

14. The method according to claim 1, further comprising the step of forming at least one convex lens element with the replication tool.

15. The method according to claim 1, further comprising the step of applying a portion of the replication material directly to a front surface of the first substrate corresponding to designated positions of the at least one optical element.

16. The method according to claim 1, further comprising the step of applying a portion of the replication material to each of the replication sections of the replication tool.

17. The method according to claim 1, further comprising the step of applying an adhesive layer of 1 to 10 μm in order to connect the first substrate and the second substrate to one another.

18. The method according to claim 1, wherein the second substrate comprises a plurality of functional elements that are chosen from the group consisting of: image capturing elements, light sources, optical elements, lens elements, electro-optical elements.

19. The method according to claim 1, further comprising the step of producing further optical elements on the second substrate, and aligning the optical elements on the first substrate and the further optical elements on the second substrate in the axial direction.

20. The method according to claim 1, wherein the at least one of the first substrate and the second substrate has a front surface with at least one recess and a back surface and wherein the at least one recess has a generally planar bottom surface running parallel to the front surface and to the back surface.

21. A method of producing a wafer scale package including two generally flat substrates, a plurality of optical elements, and a plurality of functional elements, wherein the substrates are stacked in an axial direction and wherein the optical elements and functional elements are arranged at a predetermined axial distance from one another, said method comprising the following steps:
providing a pre-shaped first substrate having a planar front surface and a back surface, the front surface defining a first substrate abutment plane running in the plane of the front surface and comprising a plurality of generally cylindrical recesses;
providing a second substrate comprising the functional elements at positions corresponding to the positions of the recesses in the first substrate;
providing a replication tool having a plurality of replication sections having structural features corresponding to a shape of the optical elements;
moving the replication tool and the first substrate towards one another, with a replication material in a deformable state located between the replication tool and the first substrate;
causing the first substrate abutment plane to abut against the replication tool with replication material remaining between the replication sections and the recesses of the first substrate;
hardening the replication material to form the optical elements;
separating the first substrate from the replication tool;
moving the first substrate and the second substrate towards one another and causing the first substrate abutment plane to abut against a front surface of the second substrate;
aligning the functional elements on the second substrate with the optical elements on the first substrate; and
connecting the first substrate and the second substrate to one another by means of an adhesive.

22. The method according to claim 21, further comprising the step of dicing the wafer scale package along lines running in axial direction to produce multiple individual optical components.

23. A wafer scale package, comprising:
a first substrate that comprises a front surface having a first at least one recess formed therein,
a second substrate that is pre-shaped and comprises a second at least one recess, and
a plurality of optical elements arranged on the front surface of the first substrate,
wherein the substrates are stacked in an axial direction,
wherein the substrates are connected to one another in such a way that the first substrate abuts the second substrate such that at least one cavity is formed by the first and second at least one recesses, and
wherein one of the plurality of optical elements is located in the at least one cavity.

24. The wafer scale package as claimed in claim 23, wherein the optical elements are attached to the first substrate and are arranged in the at least one cavity at a predetermined axial distance from at least one of a front surface or a back surface of the second substrate.

25. The wafer scale package according to claim 23, wherein the first substrate and the second substrate are pre-shaped substrates each having a front surface and a back surface and said first and second at least one recesses are formed in at least one of said front surface and back surface.

26. The wafer scale package according to claim 25, wherein replicated optical elements are arranged in said second at least one recess of the second substrate.

27. A wafer scale package, comprising:
a first substrate having a front surface with a first at least one recess formed therein,
a second substrate having a second at least one recess formed therein and comprising a plurality of functional elements that are chosen from the group consisting of: image capturing elements, light sources, optical elements, lens elements, electro-optical elements
wherein the substrates are stacked in an axial direction and are pre-shaped,
wherein the substrates are connected to one another in such a way that the first substrate abuts the second substrate such that at least one cavity is formed by the first and second at least one recesses, and
wherein one of the plurality of optical elements is located in the at least one cavity.

28. The wafer scale package according to claim 27, wherein the functional elements are replicated optical elements.

29. The wafer scale package as claimed in claim 27, wherein the optical elements are attached to the first substrate and are arranged in the at least one cavity at a predetermined axial distance from at least one of a front surface or a back surface of the second substrate.

30. The wafer scale package as claimed in claim 27, wherein the optical elements are arranged in the first at least one recess in the first substrate.

31. The wafer scale package according to claim 27, wherein the first substrate and the second substrate are pre-shaped substrates each having a front surface and a back surface and at least one recess in at least one of said front surface and back surface.

32. The wafer scale package according to claim 31, wherein replicated optical elements are arranged in said second at least one recess of the second substrate.

33. A wafer scale package, comprising:
   a first substrate having a first at least one recess,
   a second substrate having a second at least one recess, and
   a plurality of optical elements,
further comprising further optical elements that are arranged on the second substrate in axial alignment with optical elements on the first substrate
   wherein the substrates are stacked in an axial direction and at least one of the first substrate and the second substrate is pre-shaped,
   wherein the substrates are connected to one another in such a way that the first substrate abuts the second substrate such that at least one cavity is formed by the first and second at least one recesses, and
   wherein one of the plurality of optical elements is located in the at least one cavity.

34. The wafer scale package as claimed in claim 33, wherein the optical elements are attached to the first substrate and are arranged in the at least one cavity at a predetermined axial distance from at least one of a front surface or a back surface of the second substrate.

35. The wafer scale package as claimed in claim 33, wherein the optical elements are arranged in the first at least one recess in the first substrate.

36. The wafer scale package according to claim 33, wherein the first substrate and the second substrate each having a front surface and a back surface and said first and second at least one recesses are formed in at least one of said front surface and back surface of said first and second substrates.

37. The wafer scale package according to claim 36, wherein replicated optical elements are arranged in said second at least one recess of the second substrate.

* * * * *